(12) United States Patent
Boehm et al.

(10) Patent No.: US 12,009,835 B2
(45) Date of Patent: Jun. 11, 2024

(54) COMMAND ADDRESS FAULT DETECTION

(71) Applicant: Micron Technology, Inc., Boise, ID (US)

(72) Inventors: Aaron P. Boehm, Boise, ID (US); Melissa I. Uribe, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/814,402

(22) Filed: Jul. 22, 2022

(65) Prior Publication Data

US 2024/0030940 A1 Jan. 25, 2024

(51) Int. Cl.
*H03M 13/11* (2006.01)
*G11C 8/06* (2006.01)
*H03M 13/09* (2006.01)

(52) U.S. Cl.
CPC .......... *H03M 13/1174* (2013.01); *G11C 8/06* (2013.01); *H03M 13/098* (2013.01)

(58) Field of Classification Search
None
See application file for complete search history.

(56) References Cited

U.S. PATENT DOCUMENTS

| | | | | |
|---|---|---|---|---|
| 5,463,643 A | * | 10/1995 | Gaskins | G06F 11/1076 714/E11.049 |
| 2009/0313533 A1 | * | 12/2009 | Bains | G06F 11/1004 714/E11.032 |
| 2022/0342749 A1 | * | 10/2022 | G | G06F 13/28 |

FOREIGN PATENT DOCUMENTS

| | | | | |
|---|---|---|---|---|
| CN | 115461815 A | * | 12/2022 | G06F 11/1004 |
| GB | 2449348 A | * | 11/2008 | G06F 11/1004 |

* cited by examiner

*Primary Examiner* — Guerrier Merant
(74) *Attorney, Agent, or Firm* — Harrity & Harrity, LLP

(57) ABSTRACT

Implementations described herein relate to command address fault detection. A memory device may receive, from a host device via a command address (CA) bus, a plurality of bits associated with a command signal or an address signal. The CA bus may be configured for communicating command signals and address signals between the memory device and the host device. The memory device may generate one or more parity bits based on the plurality of bits. The one or more parity bits may be generated using a parity generation process that is common to the memory device and the host device. The memory device may transmit, to the host device, the one or more parity bits.

25 Claims, 6 Drawing Sheets

COMMAND ADDRESS FAULT DETECTION

TECHNICAL FIELD

The present disclosure generally relates to memory devices, memory device operations, and, for example, to command address fault detection.

BACKGROUND

Memory devices are widely used to store information in various electronic devices. A memory device includes memory cells. A memory cell is an electronic circuit capable of being programmed to a data state of two or more data states. For example, a memory cell may be programmed to a data state that represents a single binary value, often denoted by a binary "1" or a binary "0." As another example, a memory cell may be programmed to a data state that represents a fractional value (e.g., 0.5, 1.5, or the like). To store information, the electronic device may write to, or program, a set of memory cells. To access the stored information, the electronic device may read, or sense, the stored state from the set of memory cells.

Various types of memory devices exist, including random access memory (RAM), read only memory (ROM), dynamic RAM (DRAM), static RAM (SRAM), synchronous dynamic RAM (SDRAM), ferroelectric RAM (FeRAM), magnetic RAM (MRAM), resistive RAM (RRAM), flash memory (e.g., NAND memory and NOR memory), and others. A memory device may be volatile or non-volatile. Non-volatile memory (e.g., flash memory) can store data for extended periods of time even in the absence of an external power source. Volatile memory (e.g., DRAM) may lose stored data over time unless the volatile memory is refreshed by a power source.

DETAILED DESCRIPTION

Figure 1:
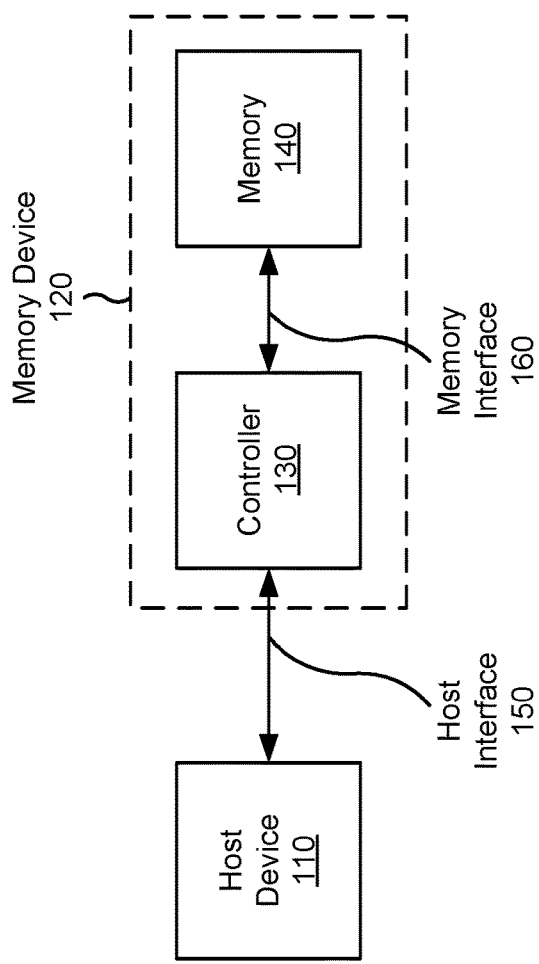
FIG. 1 is a diagram illustrating an example system capable of command address fault detection.

A system may include a memory device and a host device, which may communicate with one another using a bus. Different packages (e.g., packages that vary in size, density, architecture, other aspects, or any combination thereof) may be used to contain the memory device. A package that contains the memory device may include multiple pins that are coupled with the bus and provide access to and from components within the memory device. In some examples, one or more of the pins may be coupled with data lines of the bus and one or more of the pins may be coupled with control lines of the bus.

In some examples, the system (e.g., the host device, the memory device, or both the host device and the memory device together) may be configured to satisfy a failure rate metric. For example, the system may be configured so that a Failure in Time (FIT) rate (e.g., a number of failures that are expected to occur in one billion hours for the system) is below a threshold. In some cases, faults in the packaging of the memory device that affect a command/address (CA) bus, a clock, or control signals in the silicon may result in undetected failures. An undetected failure may occur when the memory device does not receive a command, does not recognize a command, reads from a wrong address, or writes to a wrong address, among other examples. In some cases, to satisfy the failure rate metric, the system may employ data reliability techniques that reduce such failures by enabling the host device and/or the memory device to detect, correct, or discard erroneous or invalid data, or any combination thereof. However, some of these data reliability techniques may not be able to address undetected failures. For example, certain error-correcting code (ECC) schemes may be able to detect and correct errors that occur within the data path, but may not be able to detect or correct errors that occur on the CA bus (e.g., since the memory device may not receive the command that includes the error).

In some cases, the memory device may need to have an undetected FIT rate (e.g., a FIT rate for undetected failures) that is below the threshold or below another threshold. In automotive applications, such as in the example of autonomous vehicles, the undetected FIT rate for the memory device may need to be less than 0.4 FIT. However, FIT rates experienced by some memory devices may not satisfy this threshold (e.g., the memory devices may have FIT rates that are greater than the threshold). For example, command faults in the memory device may contribute 1 FIT, gross faults that affect the ability of the memory device to receive commands may contribute 7 FIT, and address faults may contribute 8 FIT. These example faults (among other faults) may result in no drive (e.g., the memory device not performing a read), wrong data (e.g., the memory device reading from a wrong address), lost data (e.g., the memory device not performing a write, or writing to the wrong location), or outputs at termination or Hi-Z. This may be especially problematic in the case of autonomous vehicles, where an error in the memory device may decrease the safety of the vehicle.

Some techniques described herein enable fault detection, and in particular, detection of faults associated with a CA bus. A host device may generate a CA word (e.g., a plurality of bits) associated with a command signal or an address signal, and may generate a first set of parity bits based on the CA word. The host device may transmit the CA word to a memory device via the CA bus. The memory device may generate a second set of parity bits based on the CA word, and may transmit the second set of parity bits to the host device via a dedicated parity pin or an existing data pin. The host device may compare the first set of parity bits and the second set of parity bits. If the first set of parity bits match (e.g., are identical to) the second set of parity bits, the CA word at the memory device may be considered to be valid. Alternatively, if the first set of parity bits do not match (e.g., are not identical to) the second set of parity bits, the CA word at the memory device may be considered to be invalid (e.g., may have one or more errors). The host device 110 may initiate a corrective action, such as a safety procedure, based on determining that the CA word is invalid. In the example automotive application, the host device may cause the autonomous vehicle to pull to the side of a road or to alert a driver of the vehicle to take manual control. In another example, the host device may attempt another transmission of the CA word to the memory device. The techniques described herein may improve the FIT rate for the system, such as by increasing the detection of errors associated with the CA bus, thereby improving the safety and reliability of the system.

FIG. 1 is a diagram illustrating an example system 100 capable of command address fault detection. The system 100 may include one or more devices, apparatuses, and/or components for performing operations described herein. For example, the system 100 may include a host device 110 and a memory device 120. The memory device 120 may include a controller 130 and memory 140. The host device 110 may communicate with the memory device 120 (e.g., the controller 130 of the memory device 120) via a host interface 150. The controller 130 and the memory 140 may communicate via a memory interface 160.

The system 100 may be any electronic device configured to store data in memory. For example, the system 100 may be a computer, a mobile phone, a wired or wireless communication device, a network device, a server, a vehicle (e.g., an automobile or an airplane), and/or an Internet of Things (IoT) device. The host device 110 may include one or more processors configured to execute instructions and store data in the memory 140. For example, the host device 110 may include a central processing unit (CPU), a graphics processing unit (GPU), a field-programmable gate array (FPGA), an application-specific integrated circuit (ASIC), and/or another type of processing component. In some implementations, the host device 110 may be or may be included in automotive applications, such as autonomous vehicles.

The memory device 120 may be any electronic device configured to store data in memory. In some implementations, the memory device 120 may be an electronic device configured to store data temporarily in volatile memory. For example, the memory device 120 may be a random-access memory (RAM) device, such as a dynamic RAM (DRAM) device or a static RAM (SRAM) device. In this case, the memory 140 may include volatile memory that requires power to maintain stored data and that loses stored data after the memory device 120 is powered off. For example, the memory 140 may include one or more latches and/or RAM, such as DRAM and/or SRAM. In some implementations, the memory 140 may include non-volatile memory configured to maintain stored data after the memory device 120 is powered off, such as NAND memory or NOR memory. For example, the non-volatile memory may store persistent firmware or other instructions for execution by the controller 130.

The controller 130 may be any device configured to communicate with the host device (e.g., via the host interface 150) and the memory 140 (e.g., via the memory interface 160). Additionally, or alternatively, the controller 130 may be configured to control operations of the memory device 120 and/or the memory 140. For example, the controller 130 may include a memory controller, a system controller, an ASIC, an FPGA, a processor, a microcontroller, and/or one or more processing components.

The host interface 150 enables communication between the host device 110 and the memory device 120. The host interface 150 may include, for example, a Small Computer System Interface (SCSI), a Serial-Attached SCSI (SAS), a Serial Advanced Technology Attachment (SATA) interface, a Peripheral Component Interconnect Express (PCIe) interface, an NVMe interface, a USB interface, a Universal Flash Storage (UFS) interface, and/or an embedded multimedia card (eMMC) interface.

The memory interface 160 enables communication between the memory device 120 and the memory 140. The memory interface 160 may include a non-volatile memory interface (e.g., for communicating with non-volatile memory), such as a NAND interface or a NOR interface. Additionally, or alternatively, the memory interface 160 may include a volatile memory interface (e.g., for communicating with volatile memory), such as a double data rate (DDR) interface.

In some implementations, the host device 110 and the memory device 120 may communicate information using one or more computer buses or pins, such as a CA bus and a parity pin. The host device 110 may communicate a CA word to the memory device 120 using the CA bus, and the memory device 120 may communicate one or more parity bits, that are based on the CA word, to the host device 110 using the parity pin. The host device 110 may determine whether the CA word was properly received by the memory device 120 based on comparing the parity bits received from the memory device 120 with a separate set of parity bits that are generated by the host device 110. Additional details regarding these features are described herein.

As indicated above, FIG. 1 is provided as an example. Other examples may differ from what is described with regard to FIG. 1.

Figure 2:
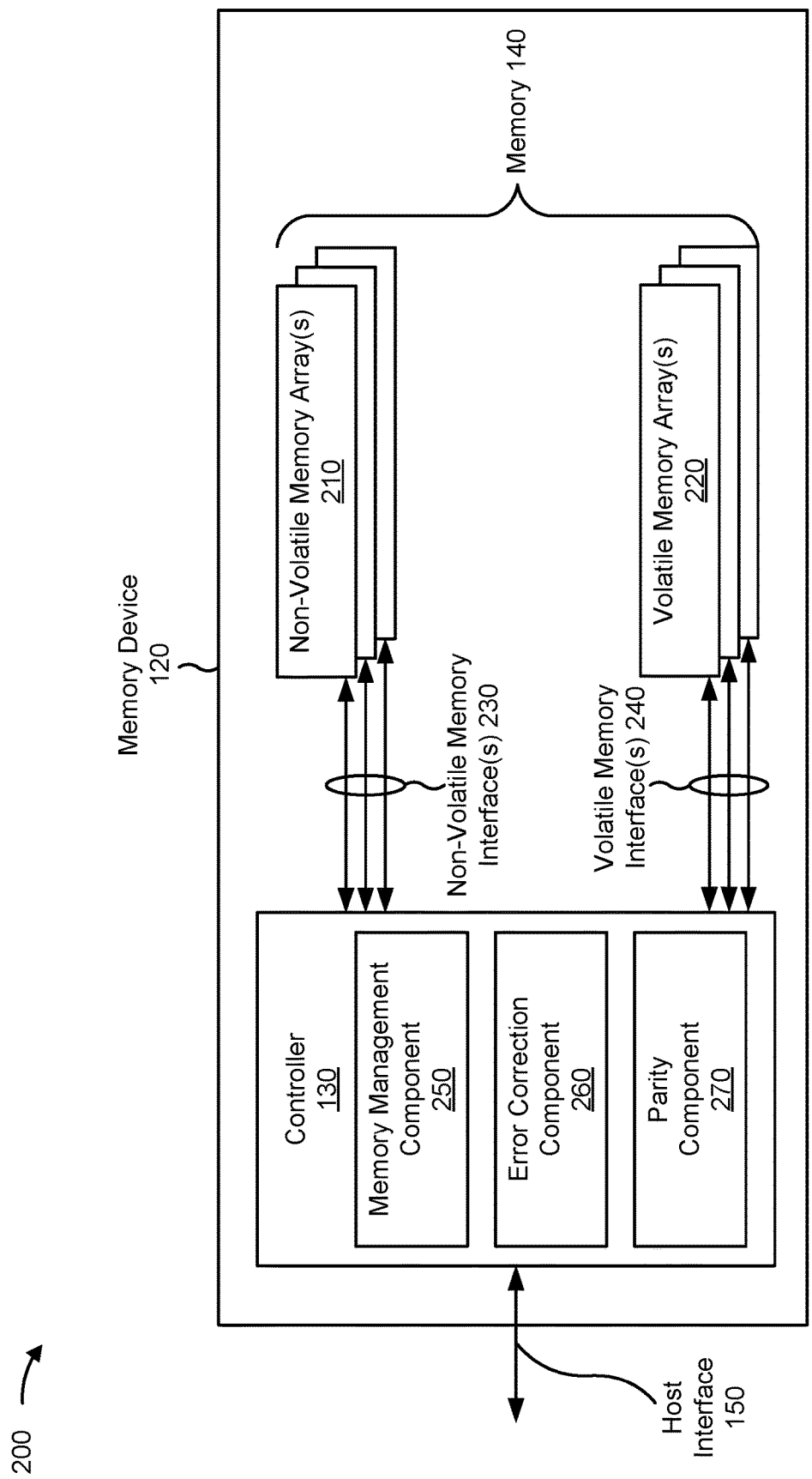
FIG. 2 is a diagram of example components included in a memory device.

FIG. 2 is a diagram of example components included in a memory device 120. As described above in connection with FIG. 1, the memory device 120 may include a controller 130 and memory 140. As shown in FIG. 2, the memory 140 may include one or more non-volatile memory arrays 210, such as one or more NAND memory arrays and/or one or more NOR memory arrays. Additionally, or alternatively, the memory 140 may include one or more volatile memory arrays 220, such as one or more SRAM arrays and/or one or more DRAM arrays. The controller 130 may transmit signals to and receive signals from a non-volatile memory array 210 using a non-volatile memory interface 230. The controller 130 may transmit signals to and receive signals from a volatile memory array 220 using a volatile memory interface 240.

The controller 130 may control operations of the memory 140, such as by executing one or more instructions. For example, the memory device 120 may store one or more instructions in the memory 140 as firmware, and the controller 130 may execute those one or more instructions. Additionally, or alternatively, the controller 130 may receive one or more instructions from the host device 110 via the host interface 150, and may execute those one or more instructions. In some implementations, a non-transitory computer-readable medium (e.g., volatile memory and/or non-volatile memory) may store a set of instructions (e.g., one or more instructions or code) for execution by the controller 130. The controller 130 may execute the set of instructions to perform one or more operations or methods described herein. In some implementations, execution of the set of instructions, by the controller 130, causes the controller 130 and/or the memory device 120 to perform one or more operations or methods described herein. In some implementations, hardwired circuitry is used instead of or in combination with the one or more instructions to perform one or more operations or methods described herein. Additionally, or alternatively, the controller 130 and/or one or more components of the memory device 120 may be configured to perform one or more operations or methods described herein. An instruction is sometimes called a "command."

For example, the controller 130 may transmit signals to and/or receive signals from the memory 140 based on the one or more instructions, such as to transfer data to (e.g., write or program), to transfer data from (e.g., read), and/or to erase all or a portion of the memory 140 (e.g., one or more memory cells, pages, sub-blocks, blocks, or planes of the memory 140). Additionally, or alternatively, the controller 130 may be configured to control access to the memory 140 and/or to provide a translation layer between the host device 110 and the memory 140 (e.g., for mapping logical addresses to physical addresses of a memory array). In some implementations, the controller 130 may translate a host interface command (e.g., a command received from the host device 110) into a memory interface command (e.g., a command for performing an operation on a memory array).

As shown in FIG. 2, the controller 130 may include a memory management component 250, an error correction component 260, and/or a parity component 270. In some implementations, one or more of these components are implemented as one or more instructions (e.g., firmware) executed by the controller 130. Alternatively, one or more of these components may be implemented as dedicated integrated circuits distinct from the controller 130.

The memory management component 250 may be configured to manage performance of the memory device 120. For example, the memory management component 250 may perform wear leveling, bad block management, block retirement, read disturb management, and/or other memory management operations. In some implementations, the memory device 120 may store (e.g., in memory 140) one or more memory management tables. A memory management table may store information that may be used by or updated by the memory management component 250, such as information regarding memory block age, memory block erase count, and/or error information associated with a memory partition (e.g., a memory cell, a row of memory, a block of memory, or the like).

The error correction component 260 may be configured to detect and/or correct errors associated with the memory device 120. For example, the error correction component 260 may be configured to detect and/or correct an error associated with writing data to or reading data from one or more memory cells of a memory array, such as a single-bit error (SBE) or a multi-bit error (MBE). In some implementations, the error correction component 260 may use an on-die error-correcting code (ECC) to detect and/or correct the errors associated with the memory device 120. The on-die ECC may mask the SBEs of the memory device 120. For example, when the on-die ECC is enabled, the error detection component 260 may detect and/or correct MBEs only. Alternatively, when the on-die ECC is disabled, the error detection component 260 may detect and/or correct both SBEs and MBEs. The ECC may be an inline ECC, which means that the ECC codes are stored on the memory device 120 with the data that is to be tested.

The parity component 270 may be configured to generate one or more parity bits. The parity component 270 may generate the one or more parity bits based on a plurality of data bits (e.g., a CA word) received from the host device 110. The parity component 270 may generate the parity bits, based on the CA word, using any type of parity generation technique or algorithm. For example, the parity component 270 may generate the parity bits by applying a Hamming Code or a cyclic redundancy check (CRC) algorithm to the CA word, among other examples. As described in more detail herein, the CA word may be received by the memory device 120 in multiple unit intervals. A unit interval may correspond to a clock cycle of the system 100, such as a clock cycle associated with the memory device 120. For example, the CA word may be received by the memory device 120 in six unit intervals, and one or more bits of the CA word may be received at each unit interval. The parity component 270 may generate the one or more parity bits based on the CA word, such as the entirety of the CA word after the CA word is received over the multiple unit intervals.

Figure 4:
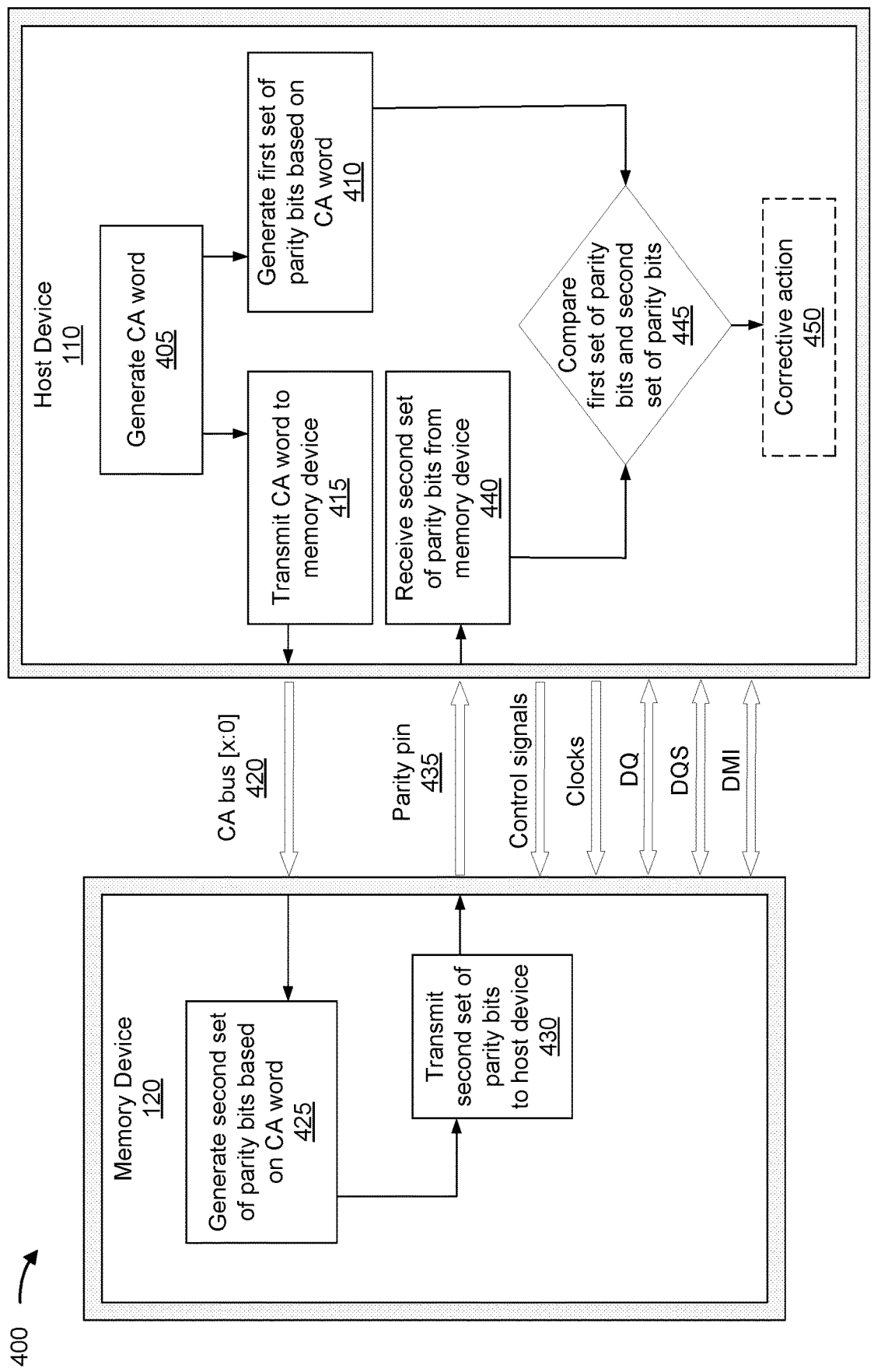
FIG. 4 is a diagram illustrating an example of command address fault detection.
Figure 6:
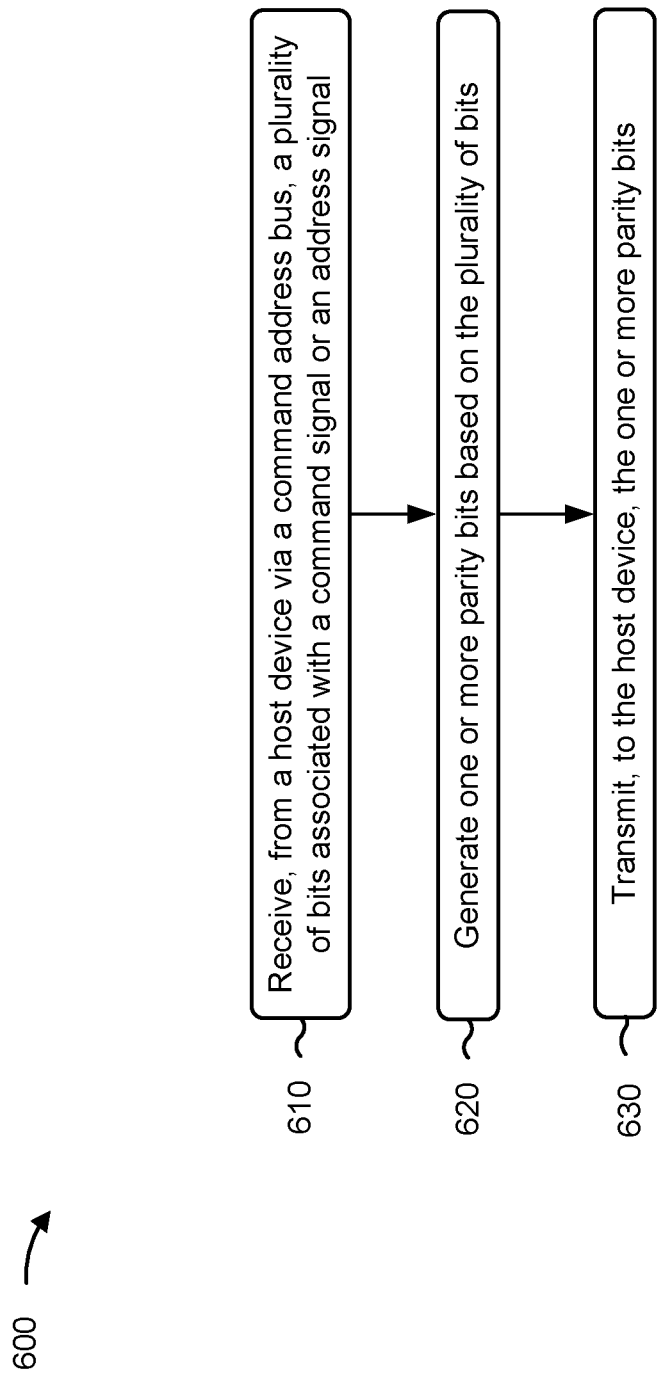
FIG. 6 is a flowchart of an example method associated with command address fault detection.

One or more devices or components shown in FIG. 2 may be used to carry out operations described elsewhere herein, such as one or more operations of FIG. 4 and/or one or more process blocks of the methods of FIG. 6. For example, the controller 130 and/or the parity component 270 may perform one or more operations and/or methods for the memory device 120.

The number and arrangement of components shown in FIG. 2 are provided as an example. In practice, there may be additional components, fewer components, different components, or differently arranged components than those shown in FIG. 2. Furthermore, two or more components shown in FIG. 2 may be implemented within a single component, or a single component shown in FIG. 2 may be implemented as multiple, distributed components. Additionally, or alternatively, a set of components (e.g., one or more components) shown in FIG. 2 may perform one or more operations described as being performed by another set of components shown in FIG. 2.

Figure 3:
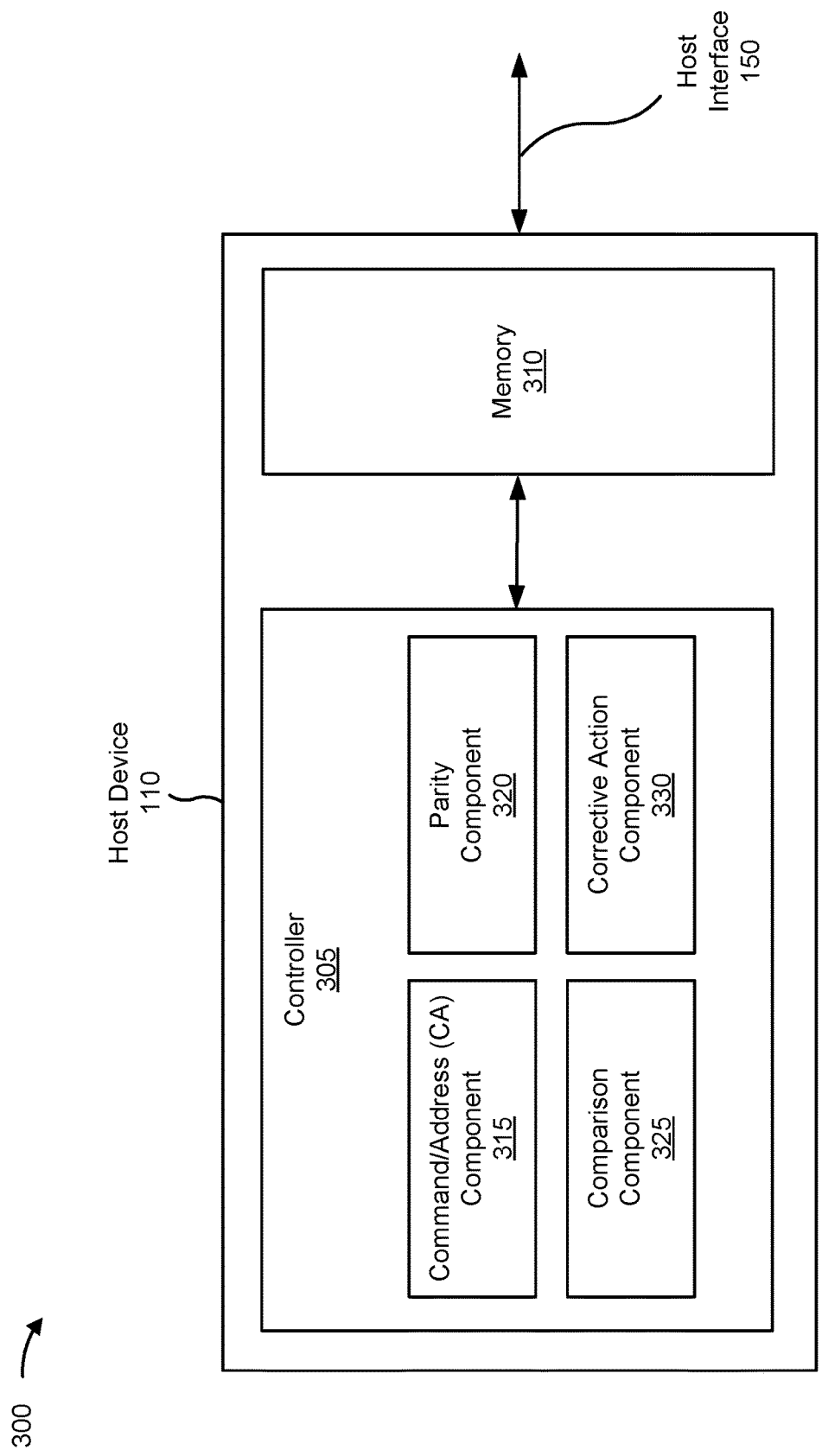
FIG. 3 is a diagram of example components included in a host device.

FIG. 3 is a diagram of example components included in a host device 110. The host device 110 may include a controller 305 and memory 310. The controller 305 associated with the host device 110 may include some or all of the features of the controller 130 associated with the memory device 120. Additionally, or alternatively, the memory 310 associated with the host device 110 may include some or all of the features of the memory 140 associated with the memory device 120.

The controller 305 may control operations of the memory 310, such as by executing one or more instructions. For example, the host device 110 may store one or more instructions in the memory 310, and the controller 305 may execute those one or more instructions. Additionally, or alternatively, the controller 305 may receive one or more instructions from the memory device 120 via the host interface 150, and may execute those one or more instructions. In some implementations, a non-transitory computer-readable medium (e.g., volatile memory and/or non-volatile memory) may store a set of instructions (e.g., one or more instructions or code) for execution by the controller 305. The controller 305 may execute the set of instructions to perform one or more operations or methods described herein. In some implementations, execution of the set of instructions, by the controller 305, causes the controller 305 and/or the host device 110 to perform one or more operations or methods described herein. In some implementations, hardwired circuitry is used instead of or in combination with the one or more instructions to perform one or more operations or methods described herein. Additionally, or alternatively, the controller 305 and/or one or more components of the host device 110 may be configured to perform one or more operations or methods described herein.

As shown in FIG. 3, the controller 305 may include a CA component 315, a parity component 320, a comparison component 325, and/or a corrective action component 330. In some implementations, one or more of these components are implemented as one or more instructions (e.g., firmware) executed by the controller 305. Alternatively, one or more of these components may be implemented as dedicated integrated circuits distinct from the controller 305.

The CA component 315 may be configured to generate a CA word. The CA word may include multiple bits and may be associated with an instruction, such as a read command or a write command, that is to be transmitted to the memory device 120. The CA word may be transmitted to the memory device 120 using one or more CA buses used for communicating data between the host device 110 and the memory device 120. For example, the CA word may be transmitted to the memory device 120 using multiple CA buses and over multiple unit intervals, as described herein. The CA word may have any length, such as any number of bits that are needed to convey the instruction to the memory device 120.

The parity component 320 may be configured to generate one or more parity bits. The parity component 320 may generate the one or more parity bits based on a CA word, such as the CA word that is generated by the CA component 315. The parity component 320 may generate the parity bits, based on the CA word, using any type of parity generation technique or algorithm. For example, the parity component 320 may generate the parity bits by applying a Hamming Code or a CRC algorithm to the CA word, among other examples. The parity component 320 associated with the host device 110 may include some or all of the features of the parity component 270 associated with the memory device 120. For example, the parity component 320 may use the same parity generation technique or algorithm as the parity component 270 for generating parity bits, as described in more detail herein.

The comparison component 325 may be configured to compare parity bits. For example, the comparison component 325 may compare a first set of parity bits, such as the parity bits generated by the parity component 270 associated with the memory device 120, and a second set of parity bits, such as the parity bits generated by the parity component 320 associated with the host device 110. The comparison component 325 may determine whether the CA word received by the memory device 120 is valid based on comparing the first set of parity bits with the second set of parity bits. The comparison component 325 may determine that the CA word received by the memory device 120 is valid based on the first set of parity bits matching (e.g., being identical to) the second set of parity bits. Alternatively, the comparison component may determine that the CA word received by the memory device 120 is invalid (e.g., has one or more errors) based on the first set of parity bits not matching (e.g., not being identical to) the second set of parity bits. In one example, if the first set of parity bits includes the bits 101010, and the second set of parity bits includes the bits 101010, the comparison component 325 may determine that the CA word received by the memory device 120 is valid. Alternatively, if the first set of parity bits includes the bits 101010, and the second set of parity bits includes the bits 100010, the comparison component 325 may determine that the CA word received by the memory device 120 is invalid.

The corrective action component 330 may be configured to initiate one or more corrective actions, such as one or more safety procedures, based on the CA word being invalid. In some implementations, the invalid CA word may result from the memory device 120 not receiving a command or not recognizing the command. This may result in the memory device 120 and/or the system 100 experiencing one or more errors. For example, the invalid CA word may result in the memory device 120 reading from a wrong address or writing to the wrong address. In the example of autonomous vehicles, the invalid CA word may decrease the safety of the vehicle associated with the memory device 120. In this case, the corrective action component 330 may initiate one or more safety procedures, such as causing the autonomous vehicle to pull to the side of a road, to alert a driver of the vehicle to take manual control, or to initiate a restart or shut down procedure (e.g., if the vehicle is not currently being used). In another example, the corrective action component 330 may cause the host device 110 to attempt another transmission of the CA word to the memory device 120. This may improve the likelihood that the memory device 120 properly receives the CA word if the error occurred during the transmission over the CA bus and/or if the error was transient in nature. In this case, the system 100 may continue to operate without interruption.

One or more devices or components shown in FIG. 3 may be used to carry out operations described elsewhere herein, such as one or more operations of FIG. 4 and/or one or more process blocks of the methods of FIG. 6. For example, the controller 305, the comparison component 325, and/or the corrective action component 330 may perform one or more operations and/or methods for the host device 110.

The number and arrangement of components shown in FIG. 3 are provided as an example. In practice, there may be additional components, fewer components, different components, or differently arranged components than those shown in FIG. 3. Furthermore, two or more components shown in FIG. 3 may be implemented within a single component, or a single component shown in FIG. 3 may be implemented as multiple, distributed components. Additionally, or alternatively, a set of components (e.g., one or more components) shown in FIG. 3 may perform one or more operations described as being performed by another set of components shown in FIG. 3.

As indicated above, FIG. 3 is provided as an example. Other examples may differ from what is described with regard to FIG. 3.

FIG. 4 is a diagram illustrating an example of CA fault detection. As shown in FIG. 4, a host device 110 and a memory device 120 may communicate. The memory device 120 may include a controller 130 and a memory 140. The controller 130 may include a memory management component 250, an error correction component 260, and/or a parity component 270, among other examples. The host device 110 may include a controller 305 and a memory 310. The controller 305 may include a CA component 315, a parity component 320, a comparison component 325, and/or a corrective action component 330, among other examples.

As shown by reference number 405, the host device 110 may generate a CA word that includes a plurality of bits. For example, the CA component 315 associated with the host device 110 may generate the CA word. The CA word may be associated with an instruction, such as a read command or a write command that is to be transmitted to the memory device 120. For example, the CA word may be an instruction to the memory device 120 to read one or more bits of data from a particular memory section of the memory device 120. Additionally, or alternatively, the CA word may be an instruction to the memory device 120 to write one or more bits of data to a particular memory section of the memory device 120. The CA word may have any length, such as any number of bits that are needed to convey the instruction to the memory device 120.

As shown by reference number 410, the host device 110 may generate a first set of parity bits. For example, the parity component 320 associated with the host device 110 may generate the first set of parity bits. The parity component 320 may generate the first set of parity bits based on a CA word, such as the CA word generated by the CA component 315. The first set of parity bits may include any number of parity bits. For example, the parity component 320, to generate the first set of parity bits, may generate any number of parity bits (e.g., four parity bits or six parity bits) based on the CA word.

In some implementations, the host device 110 and/or the parity component 320 may generate the first set of parity bits, based on the CA word, using any type of parity generation technique or algorithm. In one example, the parity component 320 may generate the first set of parity bits by applying a Hamming Code to the CA word. Applying the Hamming Code to the CA word may include generating three parity bits for each four bits of the CA word. The host device 110 and/or the memory device 120 may detect an error based on any one of the seven bits being corrupted during transmission. In another example, the parity component 320 may generate the first set of parity bits by applying a CRC algorithm to the CA word. Applying the CRC algorithm to the CA word may include calculating a check value to be added to one or more CA word portions (e.g., every certain number of CA word bits). The calculation may be repeated by the memory device 120 when the CA word is received by the memory device 120, and in the event that the check values do not match, corrective action can be taken against the data corruption. However, as described herein, any type of parity generation technique or algorithm may be used to generate the parity bits based on the CA word.

As shown by reference number 415, the host device 110 may transmit the CA word to the memory device 120. The host device 110 may transmit the CA word to the memory device 120 via the CA bus 420. In some implementations, the CA bus 420 may include a number of CA pins. For example, CA bus [x:0] may include x CA pins for transmitting the CA word from the host device 110 to the memory device 120. In some implementations, the host device 110 may transmit a single bit of the CA word, per CA pin, over a plurality of unit intervals. Thus, for each CA pin used for communicating the CA word between the host device 110 and the memory device 120, one bit of the CA word may be transmitted per unit interval. In an example where the CA word is 24 bits, and the CA bus 420 includes four CA pins, four bits of the CA word (one bit per pin) may be transmitted from the host device 110 to the memory device 120 during each unit interval. Thus, the transmission of the CA word from the host device 110 to the memory device may be complete after six clock cycles.

As shown by reference number 425, the memory device 120 may generate a second set of parity bits. For example, the parity component 270 associated with the memory device 120 may generate the second set of parity bits. The parity component 270 may generate the second set of parity bits based on the CA word. In some implementations, the memory device 120 and/or the parity component 270 may receive the CA word from the host device 110, may buffer the CA word, and may generate the second set of parity bits after (e.g., immediately after) buffering the CA word. The second set of parity bits may include any number of parity bits. For example, the parity component 270, to generate the second set of parity bits, may generate any number of parity bits (e.g., four parity bits or six parity bits) based on applying a parity generation algorithm to the CA word (e.g., to the entirety of the CA word). The memory device 120 and/or the parity component 270 may generate the second set of parity bits, based on the CA word, using any type of parity generation technique or algorithm, such as the Hamming Code of the CRC algorithm described herein. In some implementations, the memory device 120 (and/or the parity component 270) may use the same parity generation technique or algorithm as the host device 110 (and/or the parity component 320). For example, the host device 110 may generate the first set of parity bits using a select parity generation technique or algorithm, and the memory device 120 may generate the second set of parity bits using the same select parity generation technique or algorithm.

In some implementations, the parity component 270 associated with the memory device 120 and/or the parity component 320 associated with the host device 110 may be configured to use multiple parity techniques or algorithms. For example, the parity component 270 may be configured to generate the first set of parity bits, and the parity component 320 may be configured to generate the second set of parity bits, using the Hamming Code or the CRC algorithm. In some cases, the memory device 120 and the host device 110 may communicate regarding which of the parity generation techniques or algorithms is to be used to generate the first set of parity bits and/or the second set of parity bits. For example, the host device 110 may generate the first set of parity bits using a select parity generation algorithm (e.g., a CRC algorithm), and may instruct the memory device 120 to generate the second set of parity bits using the select parity generation algorithm (e.g., the CRC algorithm).

In some implementations, the parity component 270 may be located a certain distance into a command path of the memory device 120. For example, the parity component 270 may be connected to the CA bus 420 through the one or more command paths. In other words, the one or more command paths may be positioned between the parity component 270 and the CA bus 420. This may enable the parity component 270 to cover more propagation lines, and may increase the circuitry covered by the parity check, thereby resulting in a higher diagnostic coverage for the CA path in the system 100.

As shown by reference number 430, the memory device 120 may transmit the second set of parity bits to the host device 110. The memory device 120 may transmit the second set of parity bits to the host device 110 via the parity pin 435. The second set of parity bits may be transmitted synchronously, such as over a plurality of unit intervals (e.g., clock cycles). In an example where the second set of parity bits includes six parity bits, the parity bits may be transmitted one bit per clock cycle, and may be fully transmitted after six clock cycles. In some implementations, the parity pin 435 may be a dedicated parity pin. For example, the parity pin 435 may be used only for transmitting parity bits from the memory device 120 to the host device 110. In some implementations, the second set of parity bits may be transmitted via another data pin. In this case, the parity pin 435 may be another data pin that is re-purposed during the parity check for transmitting the second set of parity bits from the memory device 120 to the host device 110. In some implementations, the parity pin 435 may be a unidirectional pin for transmitting parity bits from the memory device 120 to the host device 110. This may enable another unidirectional data pin, for transmitting other data from the memory device 120 to the host device 110, to be used or re-purposed for transmitting the parity bits from the memory device 120 to the host device 110.

As shown by reference number 440, the host device 110 may receive the second set of parity bits from the memory device 120. The host device 110 may receive the second set of parity bits from the memory device 120 via the parity pin

435. As described herein, the second set of parity bits may be transmitted by the memory device 120, and may be received by the host device 110, over a plurality of unit intervals. In the example where the second set of parity bits includes six parity bits, the parity bits may be received one bit per clock cycle, and may be fully received by the host device 110 after six clock cycles.

As shown by reference number 445, the host device 110 may compare the first set of parity bits and the second set of parity bits. For example, the host device 110 and/or the comparison component 325 may compare the first set of parity bits generated by the parity component 270 associated with the memory device 120 and the second set of parity bits generated by the parity component 320 associated with the host device 110. The comparison component 325 may determine whether the CA word received by the memory device 120 is valid based on comparing the first set of parity bits with the second set of parity bits. The comparison component 325 may determine that the CA word received by the memory device 120 is valid based on the first set of parity bits matching (e.g., being identical to) the second set of parity bits. Alternatively, the comparison component may determine that the CA word received by the memory device 120 is invalid (e.g., has one or more errors) based on the first set of parity bits not matching (e.g., not being identical to) the second set of parity bits. In one example, if the first set of parity bits includes the bits 101010, and the second set of parity bits includes the bits 101010, the comparison component 325 may determine that the CA word received by the memory device 120 is valid. Alternatively, if the first set of parity bits includes the bits 101010, and the second set of parity bits includes the bits 100010, the comparison component 325 may determine that the CA word received by the memory device 120 is invalid.

As shown by reference number 450, the host device 110 may perform a corrective action. The host device 110 and/or the corrective action component 330 may be configured to initiate one or more corrective actions based on the CA word being invalid. Alternatively, the host device 110 and/or the corrective action component 330 may not initiate any corrective actions based on the CA word being valid. In some implementations, the invalid CA word may result from the memory device 120 not receiving a command or not recognizing the command. This may result in the memory device 120 and/or the system 100 experiencing one or more errors. For example, the invalid CA word may result in the memory device 120 reading from a wrong address or writing to the wrong address. In the example of autonomous vehicles, the invalid CA word may decrease the safety of the vehicle associated with the memory device 120. In this case, the host device 110 and/or the corrective action component 330 may initiate one or more safety procedures, such as causing the autonomous vehicle to pull to the side of a road, to alert a driver of the vehicle to take manual control, or to initiate a restart or shut down procedure (e.g., if the vehicle is not currently being used). In another example, the corrective action component 330 may cause the host device 110 to attempt another transmission of the CA word to the memory device 120. This may improve the likelihood that the memory device 120 properly receives the CA word if the error occurred during the transmission over the CA bus and/or if the error was transient in nature. In this case, the system 100 may continue to operate without interruption.

As shown in the figure, the host device 110 and the memory device 120 may communicate via one or more buses. A bus may be a group of electrical lines or wires that can carry computer signals. The electrical lines may be categorized based on a function of the electrical line or the components associated with the electrical line. For example, power lines may provide electrical power to attached components, command lines may provide control for the synchronization and operation of the bus and its modules, address lines may designate the source or destination of a data signal, and data lines may carry data or instructions between components. As described herein, the CA bus may be a unidirectional bus for transmitting a CA word from the host device 110 to the memory device 120, and the parity bus (or parity pin) may be a unidirectional bus (or pin) that is used for transmitting parity bits from the memory device 120 to the host device 110. Additionally, or alternatively, the host device 110 and the memory device 120 may communicate control signals, clock signals, data (DQ) signals, data strobe encoding (DQS) signals, or data mask inversion (DMI) signals, among other examples. The control signals may be used to set up communication channels between the host device 110 and the memory device 120 and to control the flow of data. For example, a control signal may be used by the host device 110 to indicate, to the memory device 120, which of the parity generation techniques or algorithms is to be used by the memory device 120 to generate the second set of parity bits. The clock signal may be a square wave signal that assists the memory device 120 and/or the host device 110 with timing and control. The DQ signal may be transmitted on every leading edge and/or on every falling edge of the clock, and the DQS signal may be used to help with timing and to improve jitter tolerance for the system 100. The DMI signal may be a bi-directional signal that is driven high to indicate that data on a data bus is inverted or that is driven low to indicate that the data is in a normal (e.g., non-inverted) state.

In some examples, the system 100 (e.g., the host device 110, the memory device 120, or both the host device 110 and the memory device 120 together) may be configured to satisfy a failure rate metric, such as to maintain a FIT rate for undetected failures that is below 0.4. In the context of memory operations, an undetected failure may result from the memory device 120 not receiving a command, not recognizing a command, reading from a wrong address, or writing to a wrong address, among other examples. In some cases, to satisfy the failure rate metric, the system 100 may employ data reliability techniques, such as on-die ECC, that reduce such failures. However, some of these data reliability techniques may not be able to identify command or address related failures. As a result, the FIT rates experienced by some memory devices may be greater than the undetected FIT rate threshold. This may result in the memory device and/or the system 100 experiencing one or more errors, which may be especially problematic in the case of autonomous vehicles, where an error in the memory device 120 may decrease the safety of the vehicle.

Using the techniques and apparatuses described herein, the number of undetected failures in the system 100 may be reduced. Specifically, the number of undetected failures resulting from communications on the CA 420 bus may be reduced. For example, the host device 110 may generate a CA word, and may generate a first set of parity bits based on the CA word. The host device 110 may transmit the CA word to the memory device 120 using the CA bus 420. The memory device 120 may generate a second set of parity bits based on the received CA word, and may transmit the second set of parity bits to the host device 110 via the parity pin 435. The parity pin 435 may be a dedicated parity pin, or may be a data pin that is re-purposed for transmitting parity bits during the parity check. The host device 110 may determine whether the CA word was properly received by the memory device 120 based on comparing the first set of parity bits and the second set of parity bits, and may initiate a corrective action when needed. As a result, the memory device 120 may detect a higher number of faults, such as faults associated with the CA bus 420 that may otherwise go undetected, thereby improving the safety and reliability of the system 100. These benefits may be realized without the addition of extra pins to the memory device 120. For example, while some memory devices may require a parity pin and a separate error pin to perform the parity check, the memory device 120 may detect the faults on the CA bus without requiring the additional error pin. In a case where the parity pin is the re-purposed data pin, this may even further reduce the number of pins that are needed to perform the parity check, while still maintaining a high degree of safety and reliability for the system 100.

As indicated above, FIG. 4 is provided as an example. Other examples may differ from what is described with regard to FIG. 4.

Figure 5:
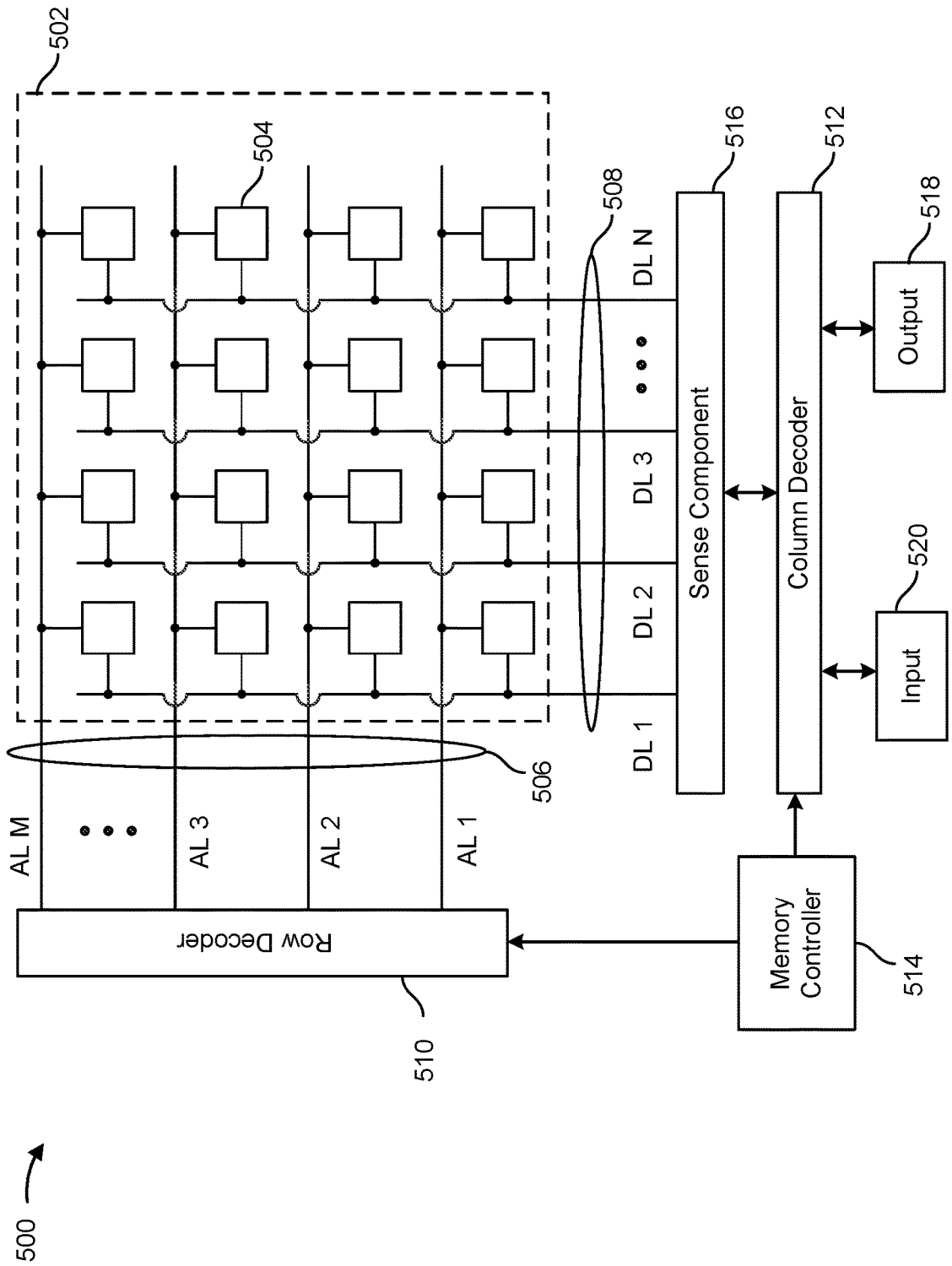
FIG. 5 is a diagrammatic view of an example memory device.

FIG. 5 is a diagrammatic view of an example memory device 500. The memory device 500 may include a memory array 502 that includes multiple memory cells 504. A memory cell 504 is programmable or configurable into a data state of multiple data states (e.g., two or more data states). For example, a memory cell 504 may be set to a particular data state at a particular time, and the memory cell 504 may be set to another data state at another time. A data state may correspond to a value stored by the memory cell 504. The value may be a binary value, such as a binary 0 or a binary 1, or may be a fractional value, such as 0.5, 1.5, or the like. A memory cell 504 may include a capacitor to store a charge representative of the data state. For example, a charged and an uncharged capacitor may represent a first data state and a second data state, respectively. As another example, a first level of charge (e.g., fully charged) may represent a first data state, a second level of charge (e.g., fully discharged) may represent a second data state, a third level of charge (e.g., partially charged) may represent a third data state, and so son.

Operations such as reading and writing (i.e., cycling) may be performed on memory cells 504 by activating or selecting the appropriate access line 506 (shown as access lines AL 1 through AL M) and digit line 508 (shown as digit lines DL 1 through DL N). An access line 506 may also be referred to as a "row line" or a "word line," and a digit line 508 may also be referred to a "column line" or a "bit line." Activating or selecting an access line 506 or a digit line 508 may include applying a voltage to the respective line. An access line 506 and/or a digit line 508 may comprise, consist of, or consist essentially of a conductive material, such as a metal (e.g., copper, aluminum, gold, titanium, or tungsten) and/or a metal alloy, among other examples. In FIG. 5, each row of memory cells 504 is connected to a single access line 506, and each column of memory cells 504 is connected to a single digit line 508. By activating one access line 506 and one digit line 508 (e.g., applying a voltage to the access line 506 and digit line 508), a single memory cell 504 may be accessed at (e.g., is accessible via) the intersection of the access line 506 and the digit line 508. The intersection of the access line 506 and the digit line 508 may be called an "address" of a memory cell 504.

In some implementations, the logic storing device of a memory cell 504, such as a capacitor, may be electrically isolated from a corresponding digit line 508 by a selection component, such as a transistor. The access line 506 may be connected to and may control the selection component. For example, the selection component may be a transistor, and the access line 506 may be connected to the gate of the transistor. Activating the access line 506 results in an electrical connection or closed circuit between the capacitor of a memory cell 504 and a corresponding digit line 508. The digit line 508 may then be accessed (e.g., is accessible) to either read from or write to the memory cell 504.

A row decoder 510 and a column decoder 512 may control access to memory cells 504. For example, the row decoder 510 may receive a row address from a memory controller 514 and may activate the appropriate access line 506 based on the received row address. Similarly, the column decoder 512 may receive a column address from the memory controller 514 and may activate the appropriate digit line 508 based on the column address.

Upon accessing a memory cell 504, the memory cell 504 may be read (e.g., sensed) by a sense component 516 to determine the stored data state of the memory cell 504. For example, after accessing the memory cell 504, the capacitor of the memory cell 504 may discharge onto its corresponding digit line 508. Discharging the capacitor may be based on biasing, or applying a voltage, to the capacitor. The discharging may induce a change in the voltage of the digit line 508, which the sense component 516 may compare to a reference voltage (not shown) to determine the stored data state of the memory cell 504. For example, if the digit line 508 has a higher voltage than the reference voltage, then the sense component 516 may determine that the stored data state of the memory cell 504 corresponds to a first value, such as a binary 1. Conversely, if the digit line 508 has a lower voltage than the reference voltage, then the sense component 516 may determine that the stored data state of the memory cell 504 corresponds to a second value, such as a binary 0. The detected data state of the memory cell 504 may then be output (e.g., via the column decoder 512) to an output component 518 (e.g., a data buffer). A memory cell 504 may be written (e.g., set) by activating the appropriate access line 506 and digit line 508. The column decoder 512 may receive data, such as input from input component 520, to be written to one or more memory cells 504. A memory cell 504 may be written by applying a voltage across the capacitor of the memory cell 504.

The memory controller 514 may control the operation (e.g., read, write, rewrite, refresh, and/or recovery) of the memory cells 504 via the row decoder 510, the column decoder 512, and/or the sense component 516. The memory controller 514 may generate row address signals and column address signals to activate the desired access line 506 and digit line 508. The memory controller 514 may also generate and control various voltages used during the operation of the memory array 502.

As indicated above, FIG. 5 is provided as an example. Other examples may differ from what is described with respect to FIG. 5.

FIG. 6 is a flowchart of an example method 600 associated with command address fault detection. In some implementations, a memory device (e.g., memory device 120) may perform or may be configured to perform one or more process blocks of FIG. 6. In some implementations, another device or a group of devices separate from or including the memory device (e.g., the system 100 and/or the host device 110) may perform or may be configured to perform one or more process blocks of FIG. 6. Additionally, or alternatively, one or more components of the memory device (e.g., the controller 130 and/or the parity component 270) may perform or may be configured to perform one or more process blocks of FIG. 6.

As shown in FIG. 6, the method 600 may include receiving, from a host device via a CA bus, a plurality of bits associated with a command signal or an address signal (block 610). The CA bus may be configured for communicating command signals and address signals between the memory device and the host device. As further shown in FIG. 6, the method 600 may include generating one or more parity bits based on the plurality of bits (block 620). The one or more parity bits may be generated using a parity generation process that is common to the memory device and the host device. As further shown in FIG. 6, the method 600 may include transmitting, to the host device, the one or more parity bits (block 630).

Although FIG. 6 shows example blocks of a method 600, in some implementations, the method 600 may include additional blocks, fewer blocks, different blocks, or differently arranged blocks than those depicted in FIG. 6. Additionally, or alternatively, two or more of the blocks of the method 600 may be performed in parallel. The method 600 is an example of one method that may be performed by one or more devices described herein. These one or more devices may perform or may be configured to perform one or more other methods based on operations described herein, such as the operations described in connection with FIG. 4.

In some implementations, a memory device includes one or more components configured to: receive, from a host device via a command address bus, a plurality of bits associated with a command signal or an address signal, wherein the command address bus is configured for communicating command signals and address signals between the memory device and the host device; generate one or more parity bits based on the plurality of bits, wherein the one or more parity bits are generated using a parity generation process that is common to the memory device and the host device; and transmit, to the host device, the one or more parity bits.

In some implementations, a system includes a host device configured to generate a plurality of bits associated with a command signal or an address signal; transmit the plurality of bits to a memory device via a command address bus, wherein the command address bus is configured for communicating command signals and address signals between the memory device and the host device; generate a first set of parity bits based on the plurality of bits and using a parity generation process; receive a second set of parity bits from the memory device; and compare the first set of parity bits and the second set of parity bits; and a memory device configured to receive, from the host device via the command address bus, the plurality of bits; generate the second set of parity bits based on the plurality of bits and using the parity generation process; and transmit, to the host device, the second set of parity bits.

In some implementations, a method comprises receiving, from a host device via a command address bus, a plurality of bits associated with a command signal or an address signal, wherein the command address bus is configured for communicating command signals and address signals between the memory device and the host device; generating one or more parity bits based on the plurality of bits and using a parity generation process; and transmitting, to the host device via a parity pin, the one or more parity bits.

The foregoing disclosure provides illustration and description but is not intended to be exhaustive or to limit the implementations to the precise forms disclosed. Modifications and variations may be made in light of the above disclosure or may be acquired from practice of the implementations described herein.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A memory device, comprising:
   one or more components configured to:
   receive, from a host device via a command address bus, a plurality of bits associated with a command signal or an address signal,
   wherein the command address bus is configured for communicating command signals and address signals between the memory device and the host device;
   generate one or more parity bits based on applying a parity generation process to the plurality of bits that are received via the command address bus,
   wherein the parity generation process is common to the memory device and the host device; and
   transmit, to the host device, the one or more parity bits.

2. The memory device of claim 1, wherein the one or more components, to transmit the one or more parity bits, are configured to transmit the one or more parity bits via a dedicated parity pin.

3. The memory device of claim 1, wherein the one or more components, to transmit the one or more parity bits, are configured to transmit the one or more parity bits via a unidirectional pin from the memory device to the host device.

4. The memory device of claim 3, wherein the unidirectional pin is a data pin.

5. The memory device of claim 1, wherein the one or more components, to receive the plurality of bits, are configured to receive a first set of bits associated with a first unit interval and a second set of bits associated with a second unit interval.

6. The memory device of claim 5, wherein the one or more components, to generate the one or more parity bits, are configured to generate the one or more parity bits based on the first set of bits and the second set of bits.

7. The memory device of claim 5, wherein the first set of bits associated with the first unit interval is received via a first command address bus and the second set of bits associated with the second unit interval is received via a second command address bus.

8. The memory device of claim 1, wherein the one or more components, to transmit the one or more parity bits, are configured to transmit the one or more parity bits in accordance with an interval.

9. The memory device of claim 1, wherein the one or more components, to generate the one or more parity bits, are configured to generate the one or more parity bits using a parity generator, wherein the parity generator receives the plurality of bits from a command path that is located between the command address bus and the parity generator.

10. A system, comprising:
a host device configured to:
generate a plurality of bits associated with a command signal or an address signal;
transmit the plurality of bits to a memory device via a command address bus,
wherein the command address bus is configured for communicating command signals and address signals between the memory device and the host device;
generate a first set of parity bits based on applying a parity generation process to the plurality of bits that are transmitted via the command address bus;
receive a second set of parity bits from the memory device; and
compare the first set of parity bits and the second set of parity bits; and
the memory device, wherein the memory device is configured to:
receive, from the host device via the command address bus, the plurality of bits;
generate the second set of parity bits based on applying the parity generation process to the plurality of bits that are received via the command address bus; and
transmit, to the host device, the second set of parity bits.

11. The system of claim 10, wherein the host device is further configured to determine a validity of the plurality of bits based on comparing the first set of parity bits and the second set of parity bits.

12. The system of claim 11, wherein the host device, to determine the validity of the plurality of bits, is configured to:
determine that the plurality of bits are valid based on the first set of parity bits being identical to the second set of parity bits; or
determine that the plurality of bits are invalid based on the first set of parity bits being different than the second set of parity bits.

13. The system of claim 12, wherein the host device is further configured to initiate a safety procedure based on determining that the plurality of bits are invalid.

14. The system of claim 10, wherein the memory device, to transmit the second set of parity bits, is configured to transmit the second set of parity bits via a dedicated parity pin, and wherein the host device, to receive the second set of parity bits, is configured to receive the second set of parity bits via the dedicated parity pin.

15. The system of claim 10, wherein the memory device, to transmit the second set of parity bits, is configured to transmit the second set of parity bits via a unidirectional data pin, and wherein the host device, to receive the second set of parity bits, is configured to receive the second set of parity bits via the unidirectional data pin.

16. The system of claim 10, wherein the host device, to transmit the plurality of bits, is configured to transmit a first set of bits using a first unit interval and a second set of bits via a second unit interval, and wherein the memory device, to receive the plurality of bits, is configured to receive the first set of bits using the first unit interval and the second set of bits using the second unit interval.

17. The system of claim 16, wherein the memory device, to generate the first set of parity bits, is configured to generate the first set of parity bits based on the first set of bits and the second set of bits.

18. The system of claim 10, wherein the memory device, to generate the second set of parity bits, is configured to generate the second set of parity bits using a parity generator, wherein the parity generator receives the plurality of bits from a command path that is located between the command address bus and the parity generator.

19. The system of claim 10, wherein the memory device, to transmit the second set of parity bits, is configured to transmit the second set of parity bits in accordance with an interval.

20. A method performed by a memory device, comprising:
receiving, from a host device via a command address bus, a plurality of bits associated with a command signal or an address signal,
wherein the command address bus is configured for communicating command signals and address signals between the memory device and the host device;
generating one or more parity bits based on applying a parity generation process to the plurality of bits that are received via the command address bus; and
transmitting, to the host device via a parity pin, the one or more parity bits.

21. The method of claim 20, wherein the parity pin is a unidirectional data pin.

22. The method of claim 20, wherein the parity generation process is common to the memory device and the host device.

23. The method of claim 20, wherein receiving the plurality of bits comprises receiving a first set of bits using a first unit interval and a second set of bits using a second unit interval.

24. The method of claim 23, wherein generating the one or more parity bits comprises generating the one or more parity bits based on the first set of bits and the second set of bits.

25. The method of claim 23, wherein the first set of bits associated with the first unit interval is received via a first command address bus and the second set of bits associated with the second unit interval is received via a second command address bus.

\* \* \* \* \*